(12) United States Patent
Zhou

(10) Patent No.: US 12,089,501 B2
(45) Date of Patent: Sep. 10, 2024

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Ming Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 134 days.

(21) Appl. No.: 17/029,726

(22) Filed: Sep. 23, 2020

(65) Prior Publication Data

US 2021/0184107 A1 Jun. 17, 2021

(30) Foreign Application Priority Data

Dec. 11, 2019 (CN) .................. 201911267728.X

(51) Int. Cl.
*H10N 50/10* (2023.01)
*G11C 11/16* (2006.01)
*H01L 29/82* (2006.01)
*H10B 61/00* (2023.01)
*H10N 50/01* (2023.01)
*H10N 50/80* (2023.01)
*H10N 50/85* (2023.01)

(52) U.S. Cl.
CPC ............. *H10N 50/10* (2023.02); *G11C 11/16* (2013.01); *G11C 11/161* (2013.01); *H01L 29/82* (2013.01); *H10B 61/00* (2023.02); *H10N 50/01* (2023.02); *H10N 50/80* (2023.02); *H10N 50/85* (2023.02)

(58) Field of Classification Search
CPC ......... H01L 43/08; H01L 43/02; H01L 43/10; H01L 43/12; H01L 27/222; G11C 11/16; G11C 11/161
See application file for complete search history.

(56) References Cited

U.S. PATENT DOCUMENTS 8,765,490 B2 * 7/2014 Zeng ................... H01L 43/12
365/158
8,860,155 B2 * 10/2014 Min-Hwa ............ G11C 11/161
365/171
8,956,883 B1 * 2/2015 Hong .................... G11C 11/155
438/3

(Continued)

FOREIGN PATENT DOCUMENTS

CN 103066199 A 4/2013
WO WO-2018125142 A1 * 7/2018

*Primary Examiner* — Yara B Green
*Assistant Examiner* — Fakeha Sehar
(74) *Attorney, Agent, or Firm* — Anova Law Group, PLLC

(57) ABSTRACT

Semiconductor structure and fabrication method are provided. The semiconductor structure includes: a substrate and a magnetic tunnel junction on the substrate. The magnetic tunnel junction includes: a bottom electromagnetic structure on the substrate, an insulating layer on the bottom electromagnetic structure, and a top electromagnetic structure on the insulating layer. The semiconductor structure further includes a sidewall tunneling layer on sidewall surfaces of the magnetic tunnel junction.

16 Claims, 5 Drawing Sheets

(56) References Cited

U.S. PATENT DOCUMENTS

| | | | |
|---|---|---|---|
| 11,063,212 B2* | 7/2021 | Hsu | H01L 43/08 |
| 2017/0098759 A1 | 4/2017 | Oh et al. | |
| 2018/0033957 A1* | 2/2018 | Zhang | H01L 43/12 |
| 2019/0088863 A1* | 3/2019 | Lu | H01L 43/08 |
| 2019/0157344 A1* | 5/2019 | Wei | H10N 50/80 |
| 2021/0098685 A1* | 4/2021 | Liou | H10N 50/01 |
| 2021/0111333 A1* | 4/2021 | Chang | H01L 43/12 |
| 2021/0184108 A1* | 6/2021 | Zhou | H01L 29/82 |
| 2021/0184109 A1* | 6/2021 | Zhou | H01L 43/08 |

* cited by examiner

SEMICONDUCTOR STRUCTURE AND FABRICATION METHOD THEREOF

CROSS-REFERENCES TO RELATED APPLICATION

This application claims the priority of Chinese Patent Application No. 201911267728.X, filed on Dec. 11, 2019, the content of which is incorporated herein by reference in its entirety.

TECHNICAL FIELD

The present disclosure generally relates to the field of semiconductor manufacturing and, more particularly, to a semiconductor structure and a fabrication method thereof.

BACKGROUND

An MRAM (i.e., Magnetic Random-Access Memory) is a non-volatile magnetic random-access memory. The MRAM has high-speed read and write capabilities of a static random-access memory (SRAM), high integration of a dynamic random-access memory (DRAM), and power consumption much lower than the DRAM. Compared with a flash memory (Flash), performance of the MRAM will not degrade as use time increases. Due to the above-mentioned characteristics, the MRAM is called as a universal memory and is considered to be able to replace the SRAM, the DRAM, an electrically erasable programmable read-only memory (EEPROM), and the Flash.

Different from existing random-access memory chip manufacturing technologies, data in the MRAM is not stored in a form of an electric charge or an electric current, but is stored in a magnetic state, which is sensed by measuring a resistance without disturbing the magnetic state. The MRAM uses a magnetic tunnel junction (MTJ) structure for data storage. An MRAM cell may include a transistor (1T) and a magnetic tunnel junction (MTJ) to form a memory cell. The MTJ structure at least includes two electromagnetic layers and an insulating layer for isolating the two electromagnetic layers. Electric current vertically flows or "passes" from one of the two electromagnetic layers to another of the two electromagnetic layers through the insulating layer. One of the two electromagnetic layers is a fixed magnetic layer, which fixes an electrode in one alternative direction through a strong fixed field. Another of the two electromagnetic layers is a freely rotatable magnetic layer, which holds an electrode in one of alternative directions.

However, performance of the magnetic tunnel junction prepared by existing technologies is poor.

SUMMARY

One aspect of the present disclosure provides a semiconductor structure. The semiconductor structure includes: a substrate and a magnetic tunnel junction on the substrate. The magnetic tunnel junction includes: a bottom electromagnetic structure on the substrate, an insulating layer on the bottom electromagnetic structure, and a top electromagnetic structure on the insulating layer. The semiconductor structure further includes a sidewall tunneling layer on sidewall surfaces of the magnetic tunnel junction.

Optionally, the sidewall tunneling layer is made of a material including at least one of boron nitride, magnesium oxide, or aluminum oxide.

Optionally, a thickness of the sidewall tunneling layer ranges from about 1 angstrom to about 20 nanometers.

Optionally, the thickness of the sidewall tunneling layer ranges from about 1 angstrom to about 5 nanometers.

Optionally, a conductive layer is provided in the substrate, and the substrate exposes a surface of the conductive layer.

Optionally, the bottom electromagnetic structure includes: a lower electrode layer on the substrate; a lower composite layer on the lower electrode layer; and a lower electromagnetic layer on the lower composite layer.

Optionally, the lower electrode layer is made of a material including at least one of copper, tungsten, aluminum, titanium, titanium nitride, or tantalum; the lower composite layer includes a plurality of conductive layers overlapped each other, and each layer of the plurality of conductive layers is made of a material including at least one of iron, platinum, cobalt, nickel, cobalt iron boron, cobalt iron, nickel iron, or lanthanum strontium manganese oxygen; and the lower electromagnetic layer is made of a material including at least one of iron, platinum, cobalt, nickel, cobalt iron boron, cobalt iron, nickel iron, or lanthanum strontium manganese oxygen.

Optionally, the top electromagnetic structure includes: an upper electromagnetic layer on the insulating layer; an upper composite layer on the upper electromagnetic layer; and an upper electrode layer on the upper composite layer.

Optionally, the upper electrode layer is made of a material including at least one of copper, tungsten, aluminum, titanium, titanium nitride, or tantalum; the upper composite layer includes a plurality of conductive layers overlapped each other, and each layer of the plurality of conductive layers is made of a material including at least one of iron, platinum, cobalt, nickel, cobalt iron boron, cobalt iron, nickel iron, or lanthanum strontium manganese oxygen; and the upper electromagnetic layer is made of a material including at least one of iron, platinum, cobalt, nickel, cobalt iron boron, cobalt iron, nickel iron, or lanthanum strontium manganese oxygen.

Optionally, the insulating layer is made of a material including at least one of magnesium oxide, aluminum oxide, silicon nitride, silicon oxynitride, hafnium dioxide, or zirconium dioxide.

Optionally, the semiconductor structure further includes: a protective layer on sidewall surfaces of the sidewall tunneling layer.

Optionally, the protective layer is made of a material including at least one of silicon oxide, silicon nitride, silicon oxynitride, silicon nitride boride, silicon oxynitride, or silicon oxynitride.

Another aspect of the present disclosure provides a method for forming the above-mentioned semiconductor structure, including: providing a substrate; and forming a magnetic tunnel junction on the substrate. The magnetic tunnel junction includes: a bottom electromagnetic structure on the substrate, an insulating layer on the bottom electromagnetic structure, and a top electromagnetic structure on the insulating layer. The method further includes forming a sidewall tunneling layer on sidewall surfaces of the magnetic tunnel junction.

Optionally, forming the sidewall tunneling layer includes: forming a magnetic conductive material film on the substrate, and a top surface and the sidewall surfaces of the magnetic tunnel junction; and etching back the magnetic conductive material film, until a surface of the substrate and the top surface of the magnetic tunnel junction are exposed, to form the sidewall tunneling layer on the surface of the substrate.

Optionally, forming the magnetic conductive material film includes a physical vapor deposition process, a chemical vapor deposition process, an atomic layer deposition process, a plasma atomic layer deposition process, or a combination thereof.

Optionally, forming the magnetic tunnel junction includes: forming a bottom electromagnetic material film on the substrate; forming an insulating film on the bottom electromagnetic material film; forming a top electromagnetic material film on the insulating film; forming a patterned layer on the top electromagnetic material film; and using the patterned layer as a mask, etching the bottom electromagnetic material film, the insulating film, and the top electromagnetic material film, until the surface of the substrate is exposed, so that the etched bottom electromagnetic material film forms the bottom electromagnetic structure, the etched insulating film forms the insulating layer, and the etched top electromagnetic material film forms the top electromagnetic structure, to form the magnetic tunnel junction on the substrate.

Optionally, forming the insulating film includes: forming an insulating material film on the bottom electromagnetic material film; and annealing the insulating material film to form the insulating film.

Optionally, forming the insulating material film includes a physical vapor deposition process, a chemical vapor deposition process, an atomic layer deposition process, or a combination thereof.

Compared with existing technologies, the technical solutions of the embodiments of the present disclosure have following beneficial effects.

In the semiconductor structure provided by the technical solutions of the present disclosure, the sidewall surfaces of the magnetic tunnel junction have the sidewall tunneling layer. The magnetic tunnel junction includes: the bottom electromagnetic structure on the substrate, the insulating layer on the bottom electromagnetic layer, and the top electromagnetic structure on the insulating layer. Since spinning electrons can tunnel through the sidewall tunneling layer, when the magnetic tunnel junction is in an on state, spinning electrons in the bottom electromagnetic structure can tunnel into the top electromagnetic structure through the insulating layer, or spinning electrons in the top electromagnetic structure can tunnel through the insulating layer into the bottom electromagnetic structure, and spinning electrons between the bottom electromagnetic structure and the top electromagnetic structure can also tunnel through the sidewall tunneling layer on the sidewall surfaces of the magnetic tunnel junction, thereby helping to reduce an on-resistance and improving the performance of the semiconductor structure.

In the method for forming the semiconductor structure provided by the technical solutions of the present disclosure, the sidewall tunneling layer is formed on the sidewall surfaces of the magnetic tunnel junction. The magnetic tunnel junction includes: the bottom electromagnetic structure on the substrate, the insulating layer on the bottom electromagnetic structure, and the top electromagnetic structure on the insulating layer. Since spinning electrons can tunnel through the sidewall tunneling layer, when the magnetic tunnel junction is in the on state, spinning electrons in the bottom electromagnetic structure can tunnel into the top electromagnetic structure through the insulating layer, or spinning electrons in the top electromagnetic structure can tunnel through the insulating layer into the bottom electromagnetic structure, and spinning electrons between the bottom electromagnetic structure and the top electromagnetic structure can also tunnel through the sidewall tunneling layer on the sidewall surfaces of the magnetic tunnel junction, thereby helping to reduce the on-resistance and improving the performance of the formed semiconductor structure.

Further, since forming the insulating material film includes the physical vapor deposition process, the chemical vapor deposition process, the atomic layer deposition process, or the combination thereof. A material formed by a deposition process is a material including an amorphous material or a polycrystalline material. By annealing the insulating material film, a high temperature can transform the material including the amorphous material or the polycrystalline material into a single crystal material. As such, performance of the formed insulating film is improved, and the performance of the formed semiconductor structure is thus improved.

BRIEF DESCRIPTION OF THE DRAWINGS

The following accompanying drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the accompanying drawings to refer to the same or like parts.

Figure 1:
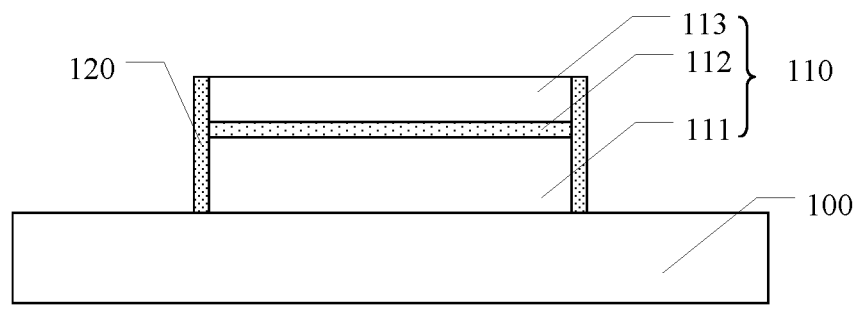
FIG. 1 is a schematic structural diagram of a semiconductor structure.

FIG. 1 is a schematic structural diagram of a semiconductor structure.

Referring to FIG. 1, a semiconductor structure includes: a substrate 100; a magnetic tunnel junction 110 on the substrate 100; and a protective layer 120 on sidewall surfaces of the magnetic tunnel junction 110. The magnetic tunnel junction includes: a bottom electromagnetic structure 111 on the substrate 100, an insulating layer 112 on the bottom electromagnetic structure 111, and a top electromagnetic structure 113 on the insulating layer 112.

The protective layer 120 can protect the sidewall surfaces of the magnetic tunnel junction, reduce influence of subsequent processes on materials of the magnetic tunnel junction 110, and help maintain integrity of the magnetic tunnel junction 110. The performance of the semiconductor structure is improved.

However, spinning electrons in the bottom electromagnetic structure 111 and the top electromagnetic structure 113 may not be able to tunnel through the protective layer 120. As a result, an on-resistance of the magnetic tunnel junction 110 is still large, and the performance of the such semiconductor structure needs to be improved.

Embodiments of the present disclosure provide a semiconductor structure, including: a substrate; a magnetic tunnel junction on the substrate; and a sidewall tunneling layer on sidewall surfaces of the magnetic tunnel junction. The magnetic tunnel junction includes: a bottom electromagnetic structure on the substrate, an insulating layer on the bottom electromagnetic structure, and a top electromagnetic structure on the insulating layer. The performance of the semiconductor structure is thus improved.

To make the above objectives, features and beneficial effects of the present disclosure clearer and more understandable, various exemplary embodiments of the present disclosure will be described in detail below with reference to the accompanying drawings.

FIGS. 2 to 10 illustrate structures corresponding to certain stages during an exemplary fabrication process of a semiconductor structure consistent with various disclosed embodiments of the present disclosure.

Figure 11:
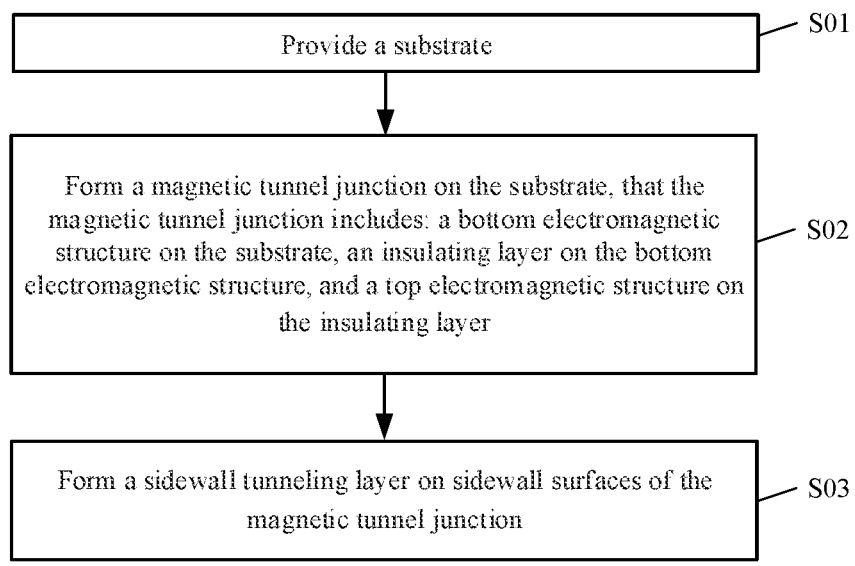
FIG. 11 illustrates an exemplary fabrication process of a semiconductor structure consistent with various disclosed embodiments of the present disclosure.

FIG. 11 illustrates an exemplary fabrication process of a semiconductor structure consistent with various disclosed embodiments of the present disclosure.

Figure 2:
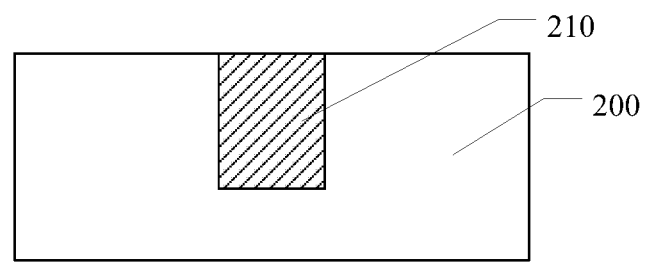
FIGS. 2 to 10 illustrate structures corresponding to certain stages during an exemplary fabrication process of a semiconductor structure consistent with various disclosed embodiments of the present disclosure.

Referring to FIG. 2, a substrate 200 is provided, according to S01 in FIG. 11.

In one embodiment, a conductive layer 210 is provided in the substrate 200, and the substrate 200 exposes a surface of the conductive layer 210.

In one embodiment, the substrate 200 includes: a semiconductor substrate (not shown in FIG. 2) and a dielectric layer (not shown in FIG. 2) on the semiconductor substrate, that the conductive layer 210 is in the dielectric layer.

The semiconductor substrate is made of a semiconductor material. In one embodiment, the semiconductor substrate is made of silicon. In other embodiments, the semiconductor substrate is made of a material including silicon carbide, silicon germanium, a compound semiconductor composed of III-V group elements, silicon-on-insulator (SOI), or germanium-on-insulator.

In one embodiment, device structures are provided in the semiconductor substrate, and the device structures include structures including PMOS transistors, NMOS transistors, CMOS transistors, resistors, capacitors, inductors, or a combination thereof.

The dielectric layer is made of a material including silicon oxide, a low-K (referring to a relative dielectric constant greater than or equal to about 2.5 and less than about 3.9) dielectric material, or an ultra-low-K (referring to a relative dielectric constant less than or equal to about 2.5) dielectric material.

In one embodiment, the dielectric layer is made of silicon oxide.

The conductive layer 210 is made of a material including copper, tungsten, aluminum, titanium, titanium nitride, tantalum, or a combination thereof.

In one embodiment, the conductive layer 210 is made of copper.

Next, a magnetic tunnel junction is formed on the substrate, according to S02 in FIG. 11. The magnetic tunnel junction includes: a bottom electromagnetic structure on the substrate, an insulating layer on the bottom electromagnetic structure, and a top electromagnetic structure on the insulating layer. FIGS. 3 to 7 can be referred to for alternative processes of forming the magnetic tunnel junction.

Figure 3:
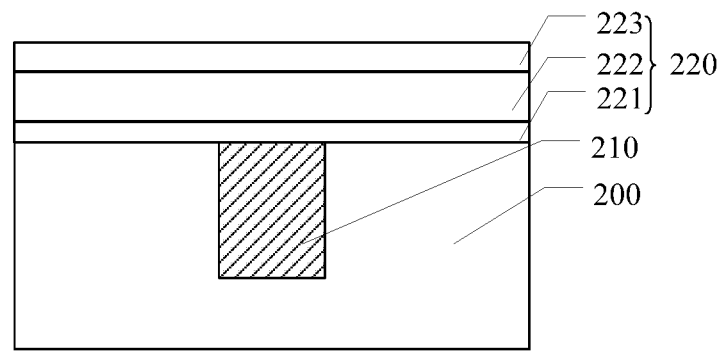

Referring to FIG. 3, a bottom electromagnetic material film 220 is formed on the substrate 200.

In one embodiment, the bottom electromagnetic material film 220 is formed on the substrate 200 and the surface of the conductive layer 210.

In one embodiment, the bottom electromagnetic material film 220 includes, a lower electrode film 221 on the substrate 200, a lower composite film 222 on the lower electrode film 221, and a lower electromagnetic film 223 on the lower composite film 222.

The lower electrode film 221 is made of a material including at least one of copper, tungsten, aluminum, titanium, titanium nitride, or tantalum.

In one embodiment, the lower electrode film 221 is made of tantalum.

The lower composite film 222 includes a plurality of conductive layers overlapped each other (not shown in FIG. 3), and each layer of the plurality of conductive layers is made of a material including iron, platinum, cobalt, nickel, cobalt iron boron, cobalt iron, nickel iron, lanthanum strontium manganese oxygen, or a combination thereof.

In one embodiment, the lower composite film 222 includes two conductive layers overlapped each other (not shown in FIG. 3), one layer of the two conductive layers is made of platinum, and another layer of the two conductive layers is made of cobalt.

In other embodiments, the plurality of conductive layers may also be made of a material including at least one of iron, platinum, cobalt, nickel, cobalt iron boron, cobalt iron, nickel iron, or lanthanum strontium manganese oxygen.

The lower electromagnetic film 223 is made of a material including at least one of iron, platinum, cobalt, nickel, cobalt iron boron, cobalt iron, nickel iron, or lanthanum strontium manganese oxygen.

In one embodiment, the lower electromagnetic film 223 is made of cobalt iron boron.

Figure 4:
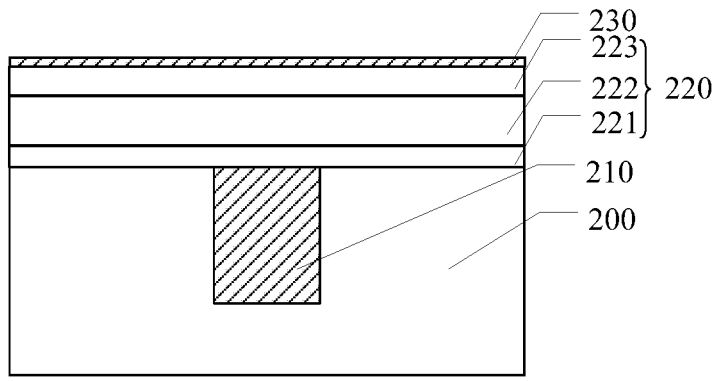
Figure 5:
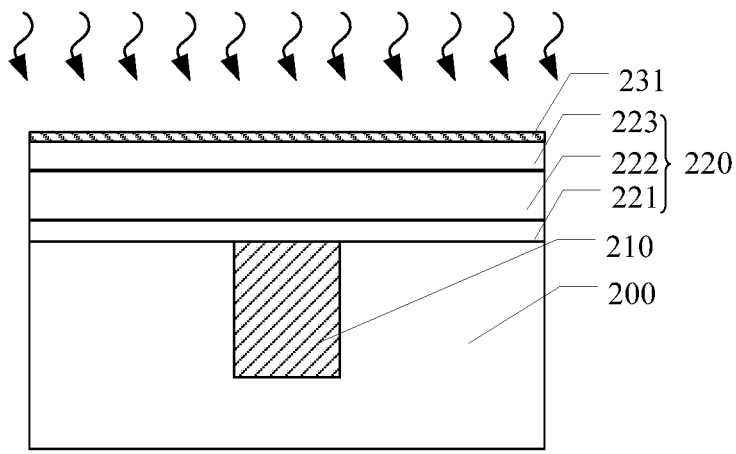

After the bottom electromagnetic material film is formed, an insulating film is formed on the bottom electromagnetic material film. FIGS. 4 to 5 can be referred to for alternative processes of forming the insulating film.

Referring to FIG. 4, an insulating material film 230 is formed on the bottom electromagnetic material film 220.

The insulating material film 230 is used to subsequently form an insulating film.

The insulating material film 230 is made of a material including at least one of magnesium oxide, aluminum oxide, silicon nitride, silicon oxynitride, hafnium dioxide, or zirconium dioxide.

In one embodiment, the insulating material film 230 is made of magnesium oxide.

A thickness of the insulating material film 230 ranges, for example, from about 1 angstrom to about 5 nanometers.

Forming the insulating material film 230 includes a physical vapor deposition process, a chemical vapor deposition process, an atomic layer deposition process, or a combination thereof.

In one embodiment, the insulating material film 230 formed by the physical vapor deposition process is made of amorphous magnesium oxide.

Referring to FIG. 5, the insulating material film 230 is annealed to form an insulating film 231.

The insulating film 231 is formed of the insulating material film 230, so that the insulating film 231 is made of a material including at least one of magnesium oxide, aluminum oxide, silicon nitride, silicon oxynitride, hafnium dioxide, or zirconium dioxide.

In one embodiment, the insulating film 231 is made of magnesium oxide.

Because forming the insulating material film 230 includes the physical vapor deposition process, the chemical vapor deposition process, the atomic layer deposition process, or the combination thereof, a material formed by a deposition process is a material including an amorphous material or a polycrystalline material. By annealing the insulating material film 230, a high temperature can transform the material including the amorphous material or the polycrystalline material into a single crystal material, so that performance of the insulating film 231 formed is improved and thus performance of a formed semiconductor structure is improved.

In one embodiment, the insulating film 231 made of the single crystal magnesium oxide material serves as a nonmagnetic insulating layer in the middle of a subsequently formed magnetic tunnel junction, which is beneficial to improving performance of the formed magnetic tunnel junction.

A temperature range of the annealing treatment is, for example, from about 300 degrees Celsius to about 400 degrees Celsius.

A significance of selecting the temperature range is that: if a temperature is greater than about 400 degrees Celsius, the temperature is too high, which is likely to cause high temperature effects on a material of the bottom electromagnetic material film 220 and devices in the substrate 200, resulting in poor performance of the formed semiconductor structure; and if the temperature is less than about 300 degrees Celsius, the temperature is too low, which is not conducive to transforming the material including the amorphous material or the polycrystalline material into the single crystal material, resulting in poor performance of the insulating film 231 formed.

Figure 6:
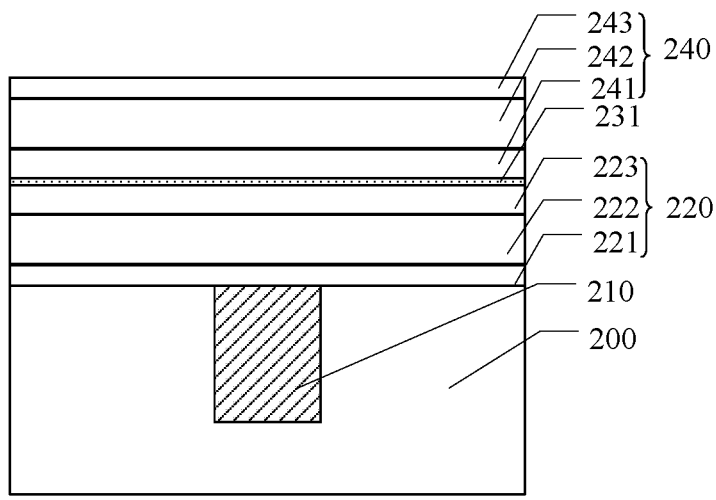

Referring to FIG. 6, a top electromagnetic material film 240 is formed on the insulating film 231.

The top electromagnetic material film 240 includes: an upper electromagnetic film 241 on the insulating film 231, an upper composite film 242 on the upper electromagnetic film 241, and an upper electrode film 243 on the upper composite film 242.

The upper electromagnetic film 241 and the lower electromagnetic film 223 are made of a same material, which will not be repeated here.

The upper composite film 242 and the lower composite film 222 are made of a same material, which will not be repeated here.

The upper electrode film 243 and the lower electrode film 221 are made of a same material, which will not be repeated here.

Figure 7:
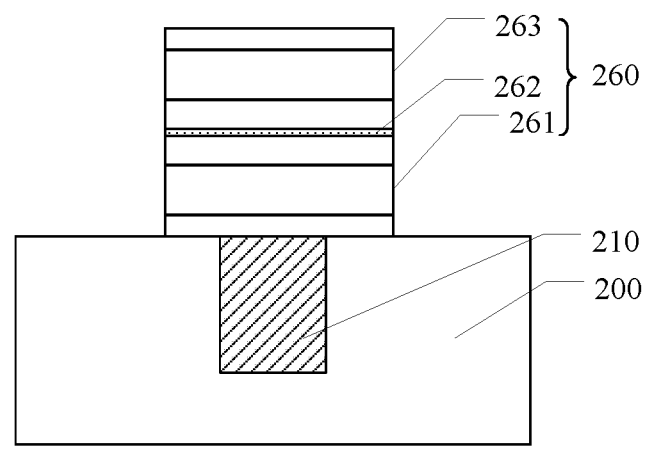

Referring to FIG. 7, after forming the top electromagnetic material film 240, a patterned layer (not shown in FIG. 7) is formed on the top electromagnetic material film 240, and the patterned layer exposes a portion of the top electromagnetic material film 240. Using the patterned layer as a mask, the bottom electromagnetic material film 220, the insulating film 231, and the top electromagnetic material film 240 are etched until a surface of the substrate 200 is exposed, so that the etched bottom electromagnetic material film 220 forms a bottom electromagnetic structure 261, the etched insulating film 231 forms an insulating layer 262, and the etched top electromagnetic material film 240 forms a top electromagnetic structure 263, to form a magnetic tunnel junction 260 on the substrate 200.

The bottom electromagnetic structure 261 includes: a lower electrode layer (not shown in FIG. 7) on the substrate 200; a lower composite layer (not shown in FIG. 7) on the lower electrode layer; and a lower electromagnetic layer (not shown in FIG. 7) on the lower composite layer.

The top electromagnetic structure 263 includes: an upper electromagnetic layer on the insulating layer; an upper composite layer on the upper electromagnetic layer; and an upper electrode layer on the upper composite layer.

In one embodiment, the patterned layer covers the top electromagnetic material film 240 on the conductive layer 210, so that after the patterning process, a bottom of the formed magnetic tunnel junction 260 is in contact with the surface of the conductive layer 210 to achieve electrical connection.

In one embodiment, after forming the magnetic tunnel junction 260, the method further includes: removing the patterned layer.

Figure 8:
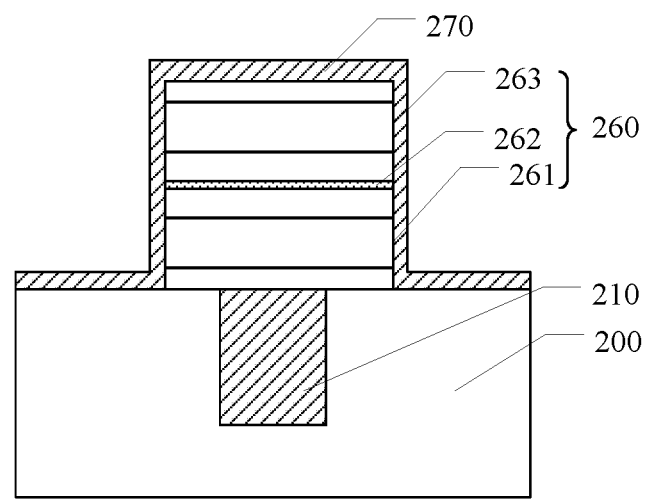
Figure 9:
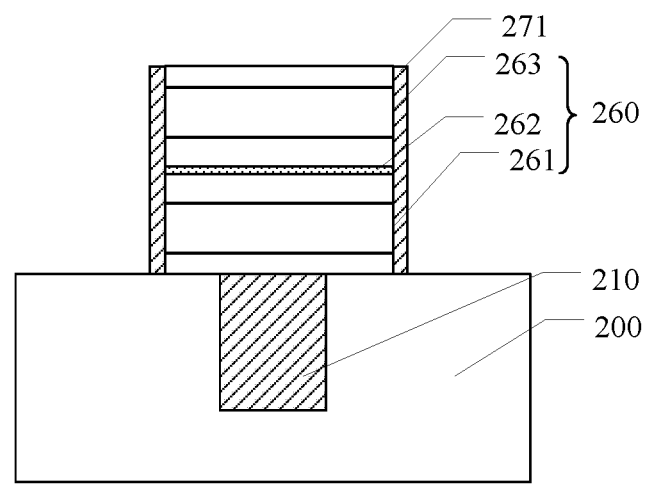

After the magnetic tunnel junction is formed, a sidewall tunneling layer is formed on sidewall surfaces of the magnetic tunnel junction, according to S03 in FIG. 11. FIGS. 8 to 9 can be referred to for alternative processes of forming the sidewall tunneling layer.

Referring to FIG. 8, a magnetic conductive material film 270 is formed on the substrate 200, and a top surface and sidewall surfaces of the magnetic tunnel junction 260.

The magnetic conductive material film 270 provides a material for subsequent formation of a sidewall tunneling layer.

Forming the magnetic conductive material film 270 includes a physical vapor deposition process, a chemical vapor deposition process, an atomic layer deposition process, a plasma atomic layer deposition process, or a combination thereof.

The magnetic conductive material film 270 is made of a material including boron nitride, magnesium oxide, or aluminum oxide.

In one embodiment, the magnetic conductive material film 270 is made of boron nitride.

Referring to FIG. 9, the magnetic conductive material film 270 is etched back until the surface of the substrate 200 and the top surface of the magnetic tunnel junction 260 are exposed, to form a sidewall tunneling layer 271 on the surface of the substrate 200.

A thickness of the sidewall tunneling layer 271 ranges from about 1 angstrom to about 20 nanometers.

A preferred range of the thickness of the sidewall tunneling layer 271 is from about 1 angstrom to about 5 nanometers.

The thickness refers to a dimension perpendicular to sidewalls of the magnetic tunnel junction 260.

A reason for the thickness of the sidewall tunneling layer 271 to be in the preferred range of about 1 angstrom to about 5 nanometers is that: if the thickness of the sidewall tunneling layer 271 is less than about 1 angstrom, magnetic conductivity effect of the sidewall tunneling layer 271 is not easy to be controlled and is easily affected by an outside world, resulting in poor stability of the magnetic tunnel junction 260; and if the thickness of the sidewall tunneling layer 271 is greater than about 5 nanometers, a larger current is required to make the sidewall tunneling layer 271 to have a tunneling and conduction function, resulting in high requirements on device performance.

Since the sidewall tunneling layer 271 is formed by etching back the magnetic conductive material film 270, the sidewall tunneling layer 271 is made of a material including at least one of boron nitride, magnesium oxide, or aluminum oxide, and the sidewall tunneling layer 271 formed has a magnetic conductivity.

In one embodiment, the sidewall tunneling layer 271 is made of boron nitride. Not only the sidewall tunneling layer 271 made of boron nitride has the magnetic conductivity, but also the magnetic tunnel junction 260 will not be oxidized during forming the sidewall tunneling layer 271, which further improves the performance of the formed semiconductor structure.

The magnetic tunnel junction 260 includes: the bottom electromagnetic structure 261 on the substrate 200, the insulating layer 262 on the bottom electromagnetic structure 261, and the top electromagnetic structure 263 on the insulating layer 262. By forming the sidewall tunneling layer 271 on the sidewall surfaces of the magnetic tunnel junction 260, since spinning electrons can tunnel through the sidewall tunneling layer 271, when the magnetic tunnel junction 260 is in an on state, spinning electrons in the bottom electromagnetic structure 261 can tunnel into the top electromagnetic structure 263 through the insulating layer 262, or spinning electrons in the top electromagnetic structure 263 can tunnel into the bottom electromagnetic structure 261 through the insulating layer 262. Spinning electrons between the bottom electromagnetic structure 261 and the top electromagnetic structure 263 can also tunnel through the sidewall tunneling layer 271 on the sidewall surfaces of the magnetic tunnel junction 260, thereby helping to reduce an on-resistance and improving the performance of the semiconductor structure.

Figure 10:
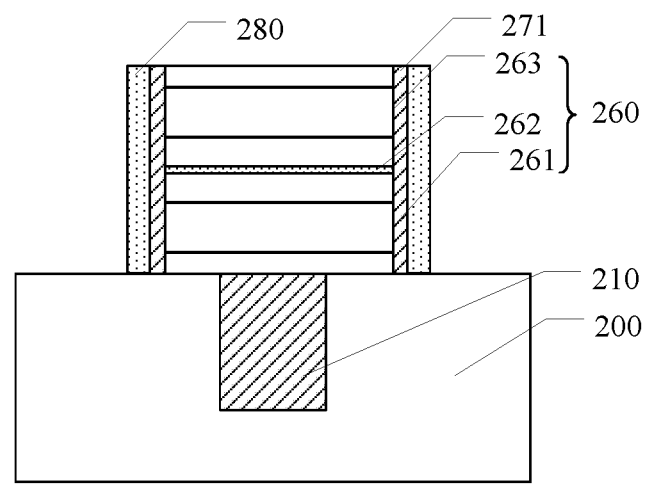

Referring to FIG. 10, after forming the sidewall tunneling layer 271, a protective layer 280 is formed on sidewall surfaces of the sidewall tunneling layer 271.

Forming the protective layer 280 includes: forming a protective material film (not shown in FIG. 10) on the surface of the substrate 200, the top surface of the magnetic tunnel junction 260, and a top surface and the sidewall surfaces of the sidewall tunneling layer 271; and etching back the protective material film until the surface of the substrate 200 and the top surface of the magnetic tunnel junction are exposed, to form the protective layer 280 on the sidewall surfaces of the sidewall tunneling layer 271.

The protective layer 280 is made of a material including at least one of silicon oxide, silicon nitride, silicon carbide nitride, silicon nitride boride, silicon oxynitride, or silicon oxynitride.

In one embodiment, the protective layer 280 is made of silicon nitride.

The protective layer 280 is used to protect the magnetic tunnel junction 260 and the sidewall tunneling layer 271, reduce impact on the magnetic tunnel junction 260 and the sidewall tunneling layer 271 from subsequent processes, and help improve integrity of the magnetic tunnel junction 260 and the sidewall tunneling layer 271. Stability of the formed semiconductor structure is improved.

Correspondingly, the embodiments of the present disclosure also provide a semiconductor structure formed by the above method. Referring to FIG. 10, the semiconductor structure includes: a substrate 200; a magnetic tunnel junction 260 on the substrate 200; and a sidewall tunneling layer 271 on sidewall surfaces of the magnetic tunnel junction 260. The magnetic tunnel junction 260 includes a bottom electromagnetic structure 261 on the substrate 200, an insulating layer 262 on the bottom electromagnetic structure 261, and a top electromagnetic structure 263 on the insulating layer 262.

Since the sidewall surfaces of the magnetic tunnel junction 260 have the sidewall tunneling layer 271, spinning electrons can tunnel through the sidewall tunneling layer 271. When the magnetic tunnel junction 260 is in the on state, spinning electrons in the bottom electromagnetic structure 261 can tunnel into the top electromagnetic structure 263 through the insulating layer 262, or spinning electrons in the top electromagnetic structure 263 can tunnel into the bottom electromagnetic structure 261 through the insulating layer 262. Spinning electrons between the bottom electromagnetic structure 261 and the top electromagnetic structure 263 can also tunnel through the sidewall tunneling layer 271 on the sidewall surfaces of the magnetic tunnel junction 260, which is beneficial to reducing the on-resistance and improving the performance of the semiconductor structure.

A detailed description is shown below with reference to the accompanying drawings.

In one embodiment, a conductive layer 210 is provided in the substrate 200, and the substrate 200 exposes a surface of the conductive layer 210.

The sidewall tunneling layer 271 is made of a material including at least one of boron nitride, magnesium oxide, or aluminum oxide.

A thickness of the sidewall tunneling layer 271 ranges from about 1 angstrom to about 20 nanometers.

In one embodiment, the thickness of the sidewall tunneling layer 271 is in a preferred range from about 1 angstrom to about 5 nanometers.

The bottom electromagnetic structure 261 includes: a lower electrode layer (not shown in FIG. 10) on the substrate 200; a lower composite layer (not shown in FIG. 10) on the lower electrode layer; and a lower electromagnetic layer (not shown in FIG. 10) on the lower composite layer.

The lower electrode layer is made of a material including at least one of copper, tungsten, aluminum, titanium, titanium nitride, or tantalum. The lower composite layer includes a plurality of conductive layers overlapped each other, and each layer of the plurality of conductive layers is made of a material including at least one of iron, platinum, cobalt, nickel, cobalt iron boron, cobalt iron, nickel iron, or lanthanum strontium manganese oxygen. The lower electromagnetic layer is made of a material including at least one of iron, platinum, cobalt, nickel, cobalt iron boron, cobalt iron, nickel iron, or lanthanum strontium manganese oxygen.

The top electromagnetic structure 263 includes: an upper electromagnetic layer (not shown in FIG. 10) on the insulating layer 262; an upper composite layer (not shown in FIG. 10) on the upper electromagnetic layer; and an upper electrode layer (not shown in FIG. 10) on the upper composite layer.

The upper electrode layer is made of a material including at least one of copper, tungsten, aluminum, titanium, titanium nitride, or tantalum. The upper composite layer includes a plurality of conductive layers overlapped each other, and each layer of the plurality of conductive layers is made of a material including at least one of iron, platinum, cobalt, nickel, cobalt iron boron, cobalt iron, nickel iron, or lanthanum strontium manganese oxygen. The upper electromagnetic layer is made of a material including at least one of iron, platinum, cobalt, nickel, cobalt iron boron, cobalt iron, nickel iron, or lanthanum strontium manganese oxygen.

The insulating layer 262 is made of a material including at least one of magnesium oxide, aluminum oxide, silicon nitride, silicon oxynitride, hafnium dioxide, or zirconium dioxide.

In one embodiment, the semiconductor structure further includes a protective layer 280 on sidewall surfaces of the sidewall tunneling layer 271.

The protective layer 280 is made of a material including at least one of silicon oxide, silicon nitride, silicon carbide nitride, silicon nitride boride, silicon oxynitride, or silicon oxynitride.

The embodiments disclosed herein are exemplary only. Other applications, advantages, alternations, modifications, or equivalents to the disclosed embodiments that are obvious to those skilled in the art are intended to be encompassed within the scope of the present disclosure.

What is claimed is:

1. A semiconductor structure, comprising:
a substrate;
a magnetic tunnel junction on the substrate, wherein the magnetic tunnel junction includes:
a bottom electromagnetic structure on the substrate, the bottom electromagnetic structure having at least one sidewall surface,
an insulating layer on the bottom electromagnetic structure, the insulating layer having at least one sidewall surface, and
a top electromagnetic structure on the insulating layer, the top electromagnetic structure having at least one sidewall surface, the at least one sidewall surface of the bottom electromagnetic structure, the at least one sidewall surface of the insulating layer, and the at least one sidewall surface of the top electromagnetic structure being coplanar with each other along a vertical direction, and sidewall surfaces of the magnetic tunnel junction including the at least one sidewall surface of the bottom electromagnetic structure, the at least one sidewall surface of the insulating layer, and the at least one sidewall surface of the top electromagnetic structure;
a sidewall tunneling layer directly formed on the sidewall surfaces of the magnetic tunnel junction, the sidewall tunneling layer being made of a material including at least one of boron nitride, magnesium oxide, or aluminum oxide, and sidewall surfaces of the sidewall tunneling layer being parallel to the vertical direction; and
a protective layer directly formed on the sidewall surfaces of the sidewall tunneling layer and in contact with the entire sidewall surfaces of the sidewall tunneling layer, the protective layer being made of a material including at least one of silicon oxide, silicon nitride, silicon carbide nitride, silicon nitride boride, or silicon oxynitride, the sidewall tunneling layer being located between the magnetic tunnel junction and the protective layer, and sidewall surfaces of the protective layer being parallel to the vertical direction;
wherein a top surface of the protective layer, a top surface of the sidewall tunneling layer, and a top surface of the top electromagnetic structure are coplanar with each other, and a bottom surface of the protective layer, a bottom surface of the sidewall tunneling layer, and a bottom surface of the bottom electromagnetic structure are coplanar with each other.

2. The semiconductor structure according to claim 1, wherein:
the sidewall tunneling layer has a thickness ranging from about 1 angstrom to about 20 nanometers.

3. The semiconductor structure according to claim 2, wherein:
the sidewall tunneling layer has a thickness ranging from about 1 angstrom to about 5 nanometers.

4. The semiconductor structure according to claim 1, wherein:
a conductive layer is provided in the substrate, and the substrate exposes a surface of the conductive layer.

5. The semiconductor structure according to claim 1, wherein:
the bottom electromagnetic structure includes:
a lower electrode layer on the substrate;
a lower composite layer on the lower electrode layer; and
a lower electromagnetic layer on the lower composite layer.

6. The semiconductor structure according to claim 5, wherein:
the lower electrode layer is made of a material including at least one of copper, tungsten, aluminum, titanium, titanium nitride, or tantalum;
the lower composite layer includes a plurality of conductive layers overlapped each other, and each layer of the plurality of conductive layers is made of a material including at least one of iron, platinum, cobalt, nickel, cobalt iron boron, cobalt iron, nickel iron, or lanthanum strontium manganese oxygen; and
the lower electromagnetic layer is made of a material including at least one of iron, platinum, cobalt, nickel, cobalt iron boron, cobalt iron, nickel iron, or lanthanum strontium manganese oxygen.

7. The semiconductor structure according to claim 1, wherein:
the top electromagnetic structure includes:
an upper electromagnetic layer on the insulating layer;
an upper composite layer on the upper electromagnetic layer; and
an upper electrode layer on the upper composite layer.

8. The semiconductor structure according to claim 7, wherein:
the upper electrode layer is made of a material including at least one of copper, tungsten, aluminum, titanium, titanium nitride, or tantalum;
the upper composite layer includes a plurality of conductive layers overlapped each other, and each layer of the plurality of conductive layers is made of a material including at least one of iron, platinum, cobalt, nickel, cobalt iron boron, cobalt iron, nickel iron, or lanthanum strontium manganese oxygen; and
the upper electromagnetic layer is made of a material including at least one of iron, platinum, cobalt, nickel, cobalt iron boron, cobalt iron, nickel iron, or lanthanum strontium manganese oxygen.

9. The semiconductor structure according to claim 1, wherein:
the insulating layer is made of a material including at least one of magnesium oxide, aluminum oxide, silicon nitride, silicon oxynitride, hafnium dioxide, or zirconium dioxide.

10. A method for forming a semiconductor structure, comprising:
providing a substrate;
forming a magnetic tunnel junction on the substrate, wherein the magnetic tunnel junction includes:
a bottom electromagnetic structure on the substrate, the bottom electromagnetic structure having at least one sidewall surface,
an insulating layer on the bottom electromagnetic structure, the insulating layer having at least one sidewall surface, and
a top electromagnetic structure on the insulating layer, the top electromagnetic structure having at least one sidewall surface, the at least one sidewall surface of the bottom electromagnetic structure, the at least one sidewall surface of the insulating layer, and the at least one sidewall surface of the top electromagnetic structure being coplanar with each other along a vertical direction, and sidewall surfaces of the magnetic tunnel junction including the at least one sidewall surface of the bottom electromagnetic structure, the at least one sidewall surface of the insulating layer, and the at least one sidewall surface of the top electromagnetic structure; and forming a sidewall tunneling layer directly on the sidewall surfaces of the magnetic tunnel junction, the sidewall tunneling layer being made of a material including at least one of boron nitride, magnesium oxide, or aluminum oxide, and sidewall surfaces of the sidewall tunneling layer being parallel to the vertical direction; and forming a protective layer directly on the sidewall surfaces of the sidewall tunneling layer and in contact with the entire sidewall surfaces of the sidewall tunneling layer, the protective layer being made of a material including at least one of silicon oxide, silicon nitride, silicon carbide nitride, silicon nitride boride, or silicon oxynitride, the sidewall tunneling layer being located between the magnetic tunnel junction and the protective layer, and sidewall surfaces of the protective layer being parallel to the vertical direction;

wherein a top surface of the protective layer, a top surface of the sidewall tunneling layer, and a top surface of the top electromagnetic structure are coplanar with each other, and a bottom surface of the protective layer, a bottom surface of the sidewall tunneling layer, and a bottom surface of the bottom electromagnetic structure are coplanar with each other.

11. The method according to claim 10, wherein forming the sidewall tunneling layer includes:

forming a magnetic conductive material film on the substrate, a top surface and the sidewall surfaces of the magnetic tunnel junction; and etching back the magnetic conductive material film until a surface of the substrate and the top surface of the magnetic tunnel junction are exposed, to form the sidewall tunneling layer on the surface of the substrate.

12. The method according to claim 11, wherein:

forming the magnetic conductive material film includes a physical vapor deposition process, a chemical vapor deposition process, an atomic layer deposition process, or a plasma atomic layer deposition process.

13. The method according to claim 10, wherein forming the magnetic tunnel junction includes:

forming a bottom electromagnetic material film on the substrate;

forming an insulating film on the bottom electromagnetic material film;

forming a top electromagnetic material film on the insulating film;

forming a patterned layer on the top electromagnetic material film, and using the patterned layer as a mask, etching the bottom electromagnetic material film, the insulating film, and the top electromagnetic material film, until the surface of the substrate is exposed, so that the etched bottom electromagnetic material film forms the bottom electromagnetic structure, the etched insulating film forms the insulating layer, and the etched top electromagnetic material film forms the top electromagnetic structure, to form the magnetic tunnel junction on the substrate.

14. The method according to claim 13, wherein forming the insulating film includes:

forming an insulating material film on the bottom electromagnetic material film; and annealing the insulating material film to form the insulating film.

15. The method according to claim 14, wherein:

forming the insulating material film includes a physical vapor deposition process, a chemical vapor deposition process, or an atomic layer deposition process.

16. The method according to claim 10, wherein forming the protective layer includes:

forming a protective material film on the surface of the substrate, a top surface of the magnetic tunnel junction, and a top surface and the sidewall surfaces of the sidewall tunneling layer; and etching back the protective material film, until the surface of the substrate and the top surface of the magnetic tunnel junction are exposed, to form the protective layer on the sidewall surfaces of the sidewall tunneling layer.

* * * * *